US011721289B2

(12) United States Patent
Wang et al.

(10) Patent No.: US 11,721,289 B2
(45) Date of Patent: Aug. 8, 2023

(54) SHIFT REGISTER CIRCUIT AND DRIVING METHOD THEREOF, GATE DRIVER AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Zhu Wang, Beijing (CN); Ling Shi, Beijing (CN); Yipeng Chen, Beijing (CN); Ke Liu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 74 days.

(21) Appl. No.: 17/628,305

(22) PCT Filed: Mar. 9, 2021

(86) PCT No.: PCT/CN2021/079681
§ 371 (c)(1),
(2) Date: Jan. 19, 2022

(87) PCT Pub. No.: WO2022/188018
PCT Pub. Date: Sep. 15, 2022

(65) Prior Publication Data
US 2023/0154409 A1 May 18, 2023

(51) Int. Cl.
*G11C 19/28* (2006.01)
*G09G 3/3266* (2016.01)
(Continued)

(52) U.S. Cl.
CPC ......... *G09G 3/3266* (2013.01); *G09G 3/2096* (2013.01); *G11C 19/28* (2013.01);
(Continued)

(58) Field of Classification Search
CPC .............. G09G 3/3266; G09G 3/2096; G09G 2310/0286; G09G 2310/08; G09G 2330/028; G11C 19/28; H10K 59/12
See application file for complete search history.

(56) References Cited

U.S. PATENT DOCUMENTS

2011/0228893 A1  9/2011  Tobita et al.
2014/0266304 A1  9/2014  Hirose
(Continued)

FOREIGN PATENT DOCUMENTS

CN  105070263 A  11/2015
CN  105810165 A  7/2016
(Continued)

*Primary Examiner* — Adam J Snyder
(74) *Attorney, Agent, or Firm* — Myers Bigel, P.A.

(57) ABSTRACT

A shift register circuit (100) includes: an input circuit (110), a reset circuit (180), a first control circuit (120), a second control circuit (130), a third control circuit (140), a fourth control circuit (150), a fifth control circuit (160), a first output circuit (170a), a second output circuit (170b) and a third output circuit (170c). The shift register circuit (100) is configured to be capable of providing three different output signals as three different gate driving signals required to drive a pixel array of a display panel (810).

19 Claims, 6 Drawing Sheets

(51) Int. Cl.
*G09G 3/20* (2006.01)
*H10K 59/12* (2023.01)

(52) U.S. Cl.
CPC .............. *G09G 2310/0286* (2013.01); *G09G 2310/08* (2013.01); *G09G 2330/028* (2013.01); *H10K 59/12* (2023.02)

(56) References Cited

U.S. PATENT DOCUMENTS

| | | | |
|---|---|---|---|
| 2017/0162153 A1 | 6/2017 | Zhao | |
| 2018/0061346 A1* | 3/2018 | Zhao | G09G 3/3677 |
| 2018/0166039 A1 | 6/2018 | Gong | |
| 2019/0012974 A1* | 1/2019 | Miyanaga | G09G 3/3677 |
| 2019/0206294 A1 | 7/2019 | Tian et al. | |
| 2019/0385554 A1* | 12/2019 | Zhao | G09G 3/3677 |
| 2020/0020266 A1 | 1/2020 | Feng et al. | |
| 2020/0160929 A1* | 5/2020 | Huang | G09G 3/3266 |
| 2020/0219428 A1 | 7/2020 | Yuan et al. | |

FOREIGN PATENT DOCUMENTS

| | | | | |
|---|---|---|---|---|
| CN | 106128378 A | | 11/2016 | |
| CN | 108154835 A | | 6/2018 | |
| CN | 108877627 A | | 11/2018 | |
| CN | 109215611 A | * | 1/2019 | .............. G09G 3/20 |
| KR | 20120118963 A | | 10/2012 | |

\* cited by examiner

SHIFT REGISTER CIRCUIT AND DRIVING METHOD THEREOF, GATE DRIVER AND DISPLAY PANEL

RELATED APPLICATIONS

The present application is a 35 U.S.C. 371 national stage application of PCT International Application No. PCT/CN2021/079681, filed on Mar. 9, 2021, the entire disclosure of which is incorporated herein by reference.

TECHNICAL FIELD

The present disclosure relates to the generation of gate driving signals and, in particular, to a shift register circuit and its driving method, a gate driver including the shift register circuit, a display panel including the gate driver, and also to a display device including the display panel.

BACKGROUND

A gate driver that includes a plurality of cascaded shift register circuits can form a gate driver on array (GOA) circuit to operate to generate and provide gate driving signals to the pixel array of a display panel. For some existing pixel circuits of display panels based on organic light-emitting diodes (OLED), three different gate driving signals are required to drive them. If a normal GOA circuit is used, three different GOA circuits are required to provide corresponding gate driving signals. This may result in a larger occupied area of the GOA circuits and thus a larger width of the panel bezel.

SUMMARY

Therefore, it would be advantageous to provide a mechanism that can alleviate, mitigate, or eliminate at least one of the above problems.

According to an aspect of the present disclosure, there is provided a shift register circuit that may include: an input circuit configured to: in response to at least one of an input terminal providing an input pulse and a first node being at a low potential, bring a second node into conduction with a high-potential voltage terminal providing a high-potential voltage signal, and in response to both the input terminal and the first node being at a high potential, bring the second node into conduction with a low-potential voltage terminal providing a low-potential voltage signal; a first control circuit configured to: in response to at least one of a first clock signal terminal providing a first clock signal and the second node being at a low potential, bring the first node into conduction with the high-potential voltage terminal, and in response to both the first clock signal terminal and the second node being at a high potential, bring the first node into conduction with the low-potential voltage terminal; a second control circuit configured to: in response to the first node being at a high potential, bring a third node into conduction with the low-potential voltage terminal, and in response to the first node being at a low potential, bring the third node into conduction with the high-potential voltage terminal; a third control circuit configured to: in response to the third node being at a high potential, bring a fourth node into conduction with the low-potential voltage terminal, and in response to the third node being at a low potential, bring the fourth node into conduction with the high-potential voltage terminal; a fourth control circuit configured to: in response to the third node being at low potential and the fourth node being at high potential, bring a fifth node into conduction with the high-potential voltage terminal, and in response to the third node being at high potential and the fourth node being at low potential, bring the fifth node into conduction with a third clock signal terminal providing a third clock signal; a fifth control circuit configured to: in response to the third node being at a low potential and the fourth node being at a high potential, bring a sixth node into conduction with the low-potential voltage terminal, and in response to the third node being at a high potential and the fourth node being at a low potential, bring the sixth node into conduction with a second clock signal terminal providing a second clock signal; a first output circuit configured to: in response to the fifth node being at a low potential, bring a first output terminal providing a first output signal into conduction with the low-potential voltage terminal, and in response to the fifth node being at a high potential, bring the first output terminal into conduction with the high-potential voltage terminal; a second output circuit configured to: in response to the sixth node being at a low potential, bring a second output terminal providing a second output signal into conduction with the high-potential voltage terminal, and in response to the sixth node being at a high potential, bring the second output terminal into conduction with the low-potential voltage terminal; and a third output circuit configured to: in response to the sixth node being at a low potential, bring a third output terminal providing a third output signal into conduction with the low-potential voltage terminal, and in response to the sixth node point being at a high potential, bring the third output terminal into conduction with the high-potential voltage terminal.

According to some exemplary embodiments, the input circuit may include: a first transistor of an N-type transistor, including a first electrode connected to the low-potential voltage terminal and a control electrode connected to the first node; a second transistor of an N-type transistor, including a first electrode connected to a second electrode of the first transistor, a second electrode connected to the second node, and a control electrode connected to the input terminal; a third transistor of a P-type transistor, including a first electrode connected to the second node, a second electrode connected to the high-potential voltage terminal, and a control electrode connected to the input terminal; a fourth transistor of a P-type transistor, including a first electrode connected to the second node, a second electrode connected to the high-potential voltage terminal and a control electrode connected to the first node.

According to some exemplary embodiments, the first control circuit may include: a fifth transistor of an N-type transistor, including a first electrode connected to the low-potential voltage terminal and a control electrode connected to the second node; a sixth transistor of an N-type transistor, including a first electrode connected to a second electrode of the fifth transistor, a second electrode connected to the first node, and a control electrode connected to the first clock signal terminal; a seventh transistor of a P-type transistor, including a first electrode connected to the first node, a second electrode connected to the high-potential voltage terminal, and a control electrode connected to the first clock signal terminal; an eighth transistor of a P-type transistor, including a first electrode connected to the first node, a second electrode connected to the high-potential voltage terminal, and a control electrode connected to the second node.

According to some exemplary embodiments, the second control circuit may include: a ninth transistor of an N-type transistor, including a first electrode connected to the low-potential voltage terminal, a second electrode connected to the third node, and a control electrode connected to the first node; a tenth transistor of a P-type transistor, including a first electrode connected to the third node, a second electrode connected to the high-potential voltage terminal, and a control electrode connected to the first node.

According to some exemplary embodiments, the third control circuit may include: an eleventh transistor of an N-type transistor, including a first electrode connected to the low-potential voltage terminal, a second electrode connected to the fourth node, and a control electrode connected to the third node; a twelfth transistor of a P-type transistor, including a first electrode connected to the fourth node, a second electrode connected to the high-potential voltage terminal, and a control electrode connected to the third node.

According to some exemplary embodiments, the fourth control circuit may include: a thirteenth transistor of a P-type transistor, including a first electrode connected to the fifth node, a second electrode connected to the high-potential voltage terminal, and a control electrode connected to the third node; a fourteenth transistor of an N-type transistor, including a first electrode connected to the third clock signal terminal, a second electrode connected to the fifth node, and a control electrode connected to the third node; a fifteenth transistor of a P-type transistor, including a first electrode connected to the third clock signal terminal, a second electrode connected to the fifth node, and a control electrode connected to the fourth node.

According to some exemplary embodiments, the fifth control circuit may include: a sixteenth transistor of an N-type transistor, including a first electrode connected to the second clock signal terminal, a second electrode connected to the sixth node, and a control electrode connected to the third node; a seventeenth transistor of a P-type transistor, including a first electrode connected to the second clock signal terminal, a second electrode connected to the sixth node, and a control electrode connected to the fourth node; an eighteenth transistor of an N-type transistor, including a first electrode connected to the low-potential voltage terminal, a second electrode connected to the sixth node, and a control electrode connected to the fourth node.

According to some exemplary embodiments, the first output circuit may include: a nineteenth transistor of an N-type transistor, including a first electrode connected to the low-potential voltage terminal, and a control electrode connected to the fifth node; a twentieth transistor of a P-type transistor, including a first electrode connected to a second electrode of the nineteenth transistor, a second electrode connected to the high-potential voltage terminal, and a control electrode connected to the fifth node; a twenty-first transistor of an N-type transistor, including a first electrode connected to the low-potential voltage terminal, a second electrode connected to the first output terminal, and a control electrode connected to the second electrode of the nineteenth transistor; a twenty-second transistor of a P-type transistor, including a first electrode connected to the first output terminal, a second electrode connected to the high-potential voltage terminal, and a control electrode connected to the control electrode of the twenty-first transistor.

According to some exemplary embodiments, the second output circuit may include: a twenty-third transistor of an N-type transistor, including a first electrode connected to the low-potential voltage terminal, and a control electrode connected to the sixth node; a twenty-fourth transistor of a P-type transistor, including a first electrode connected to a second electrode of the twenty-third transistor, a second electrode connected to the high-potential voltage terminal, and a control electrode connected to the sixth node; a twenty-fifth transistor of an N-type transistor, including a first electrode connected to the low-potential voltage terminal, and a control electrode connected to the second electrode of the twenty-third transistor; a twenty-sixth transistor of a P-type transistor, including a first electrode connected to a second electrode of the twenty-fifth transistor, a second electrode connected to the high-potential voltage terminal, and a control electrode connected to the control electrode of the twenty-fifth transistor; a twenty-seventh transistor of an N-type transistor, including a first electrode connected to the low-potential voltage terminal, a second electrode connected to the second output terminal, and a control electrode connected to the second electrode of the twenty-fifth transistor; a twenty-eighth transistor of a P-type transistor, including a first electrode connected to the second output terminal, a second electrode connected to the high-potential voltage terminal, and the control electrode connected to the control electrode of the twenty-seventh transistor.

According to some exemplary embodiments, the third output circuit may include: a twenty-ninth transistor of an N-type transistor, including a first electrode connected to the low-potential voltage terminal, and a control electrode connected to the sixth node; a thirtieth transistor of a P-type transistor, including a first electrode connected to a second electrode of the twenty-ninth transistor, a second electrode connected to the high-potential voltage terminal, and a control electrode connected to the sixth nodes; a thirty-first transistor of an N-type transistor, including a first electrode connected to the low-potential voltage terminal, a second electrode connected to the third output terminal, and a control electrode connected to the second electrode of the twenty-ninth transistor; a thirty-second transistor of a P-type transistor, including a first electrode connected to the third output terminal, a second electrode connected to the high-potential voltage terminal, and a control electrode connected to the control electrode of the thirty-first transistor.

According to some exemplary embodiments, the shift register circuit may further include a reset circuit configured to: in response to a reset terminal providing a reset pulse being at a high potential, bring the first node into conduction with the low-potential voltage terminal.

According to some exemplary embodiments, the reset circuit may include a thirty-third transistor of an N-type transistor, including a first electrode connected to the low-potential voltage terminal, a second electrode connected to the first node, and a control electrode connected to the reset terminal.

According to another aspect of the present disclosure, there is provided a gate driver that may include N shift register circuits as described above that are cascaded, wherein N is an integer greater than or equal to 2, and wherein a first output terminal of an m-th shift register circuit of the N shift register circuits is connected to an input terminal of an (m+1)-th shift register circuit of the N shift register circuits, m is an integer and $1 \leq m < N$.

According to yet another aspect of the present disclosure, there is provided a display panel that may include: the gate driver as described above; a high-potential voltage signal line configured to transmit the high-potential voltage signal; a low-potential voltage signal line configured to transmit the low-potential voltage signal; a first clock signal line configured to transmit a first clock line signal; a second clock signal line configured to transmit a second clock line signal; a third clock signal line configured to transmit a third clock line signal; a reset signal line configured to transmit the reset pulse; wherein, a high-potential voltage terminal of each shift register circuit is connected to the high-potential voltage signal line; wherein, a low-potential voltage terminal of each shift register circuit is connected to the low-potential voltage signal line; wherein, a reset terminal of each shift register circuit is connected to the reset signal line; wherein a first clock signal terminal and a second clock signal terminal of a (3k−2)-th shift register circuit of the N shift register circuits are connected to the first clock signal line, and a third clock signal terminal of the (3k−2)-th shift register circuit is connected to the third clock signal line; wherein a first clock signal terminal and a second clock signal terminal of a (3k−1)-th shift register circuit of the N shift register circuits are connected to the second clock signal line, and a third clock signal terminal of the (3k−1)-th shift register circuit is connected to the first clock signal line; wherein a first clock signal terminal and a second clock signal terminal of a (3k)-th shift register circuit of the N shift register circuits are connected to the third clock signal line, and a third clock signal terminal of the (3k)-th shift register circuit is connected to the second clock signal line; wherein k is an integer greater than 0, and $3k \leq N+2$; wherein the first clock line signal, the second clock line signal, and the third clock line signal have a same period, have a duty ratio of 2/3, and are sequentially delayed by 1/3 period in timing sequence. In addition, in the case that the shift register circuit included in a corresponding gate driver does not include a reset circuit, the above-described display panel according to the present disclosure may not include a reset signal line configured to transmit a reset pulse.

According to yet another aspect of the present disclosure, there is provided a display device that may include: the display panel as described above; a timing controller configured to control operation of the display panel, wherein the timing controller is configured to provide the first clock line signal, the second clock line signal, the third clock signal line and the reset pulse to the first clock signal line, the second clock signal line, the third clock signal line and the reset signal line, respectively; and a voltage generator configured to provide the high-potential voltage signal and the low-potential voltage signal to the high-potential voltage signal line and the low-potential voltage signal line, respectively. In addition, in the case that the corresponding display panel does not include a reset signal line, the timing controller in the above-mentioned display device according to the present disclosure may be configured to provide the first clock line signal, the second clock line signal, and the third clock line signal to the first clock signal line, the second clock signal line, and the third clock signal line, respectively.

According to yet another aspect of the present disclosure, there is provided a method for driving the shift register circuit as described above, including: applying the high-potential voltage signal to the high-potential voltage terminal; applying the low-potential voltage signal to the low-potential voltage terminal; applying the first clock signal to the first clock signal terminal; applying the second clock signal to the second clock signal terminal; applying the third clock signal to the third clock signal terminal; applying the input pulse to the input terminal; wherein, the first clock signal, the second clock signal and the third clock signal have a same period, have a duty ratio of 2/3, the first clock signal and the second clock signal have a same timing sequence, and the third clock signal is delayed by 2/3 period in timing sequence when compared with the first clock signal; wherein, a pulse width of the output pulse is 1/3 of the period, and a falling edge of the input pulse is aligned with a rising edge of the first clock signal in timing sequence.

BRIEF DESCRIPTION OF DRAWINGS

The specific embodiments of the present disclosure are described in detail below in conjunction with the drawings, so that the problems to be solved by the present disclosure, the above-mentioned and other objectives, features and advantages can be more fully appreciated and understood. In the drawings.

Figure 1:
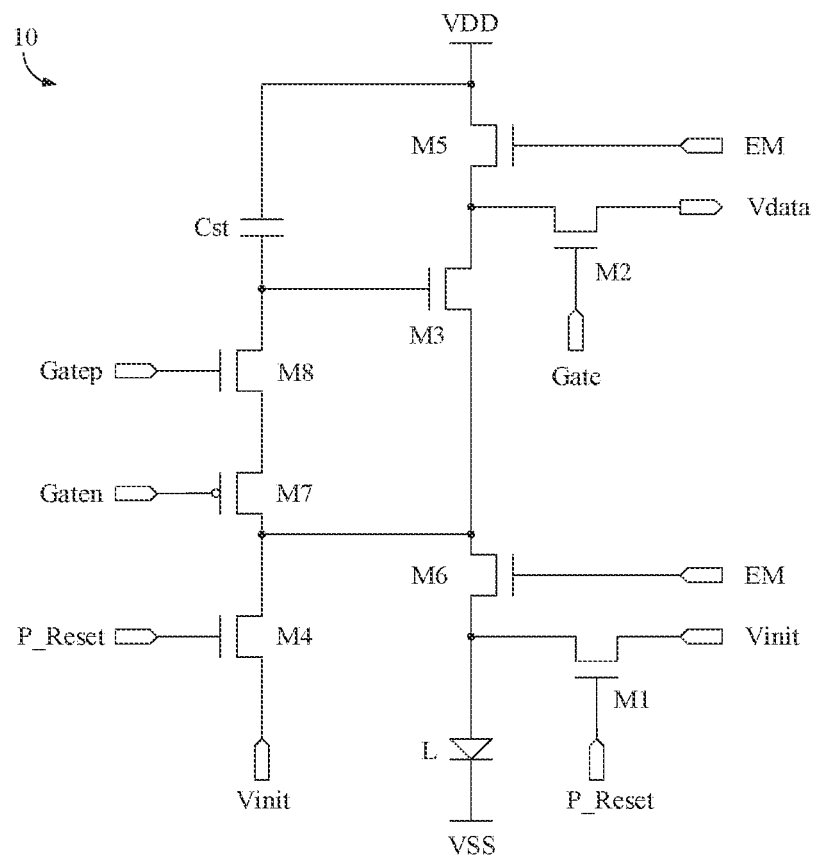
FIG. 1 schematically shows a pixel circuit known in the related art.

It should be understood that the contents shown in the drawings are only schematic, and therefore they are not necessarily drawn to scale. In addition, throughout all the drawings, the same or similar components, portions, parts and/or elements are denoted by the same or similar reference signs.

DETAILED DESCRIPTION OF EMBODIMENTS

The specific embodiments of the present disclosure will be described in detail below in conjunction with the drawings. It should be understood that the terms used in the present disclosure are for the purpose of describing specific embodiments only and are not intended to limit the invention. As used in the present disclosure, the singular forms "a," "an," and "the" are intended to include the plural forms as well, unless explicitly indicated otherwise in the context. It should also be understood that the terms "comprise" and/or "includes", when used in the present disclosure, indicate the presence of the indicated features, entities, steps, operations, elements and/or parts, but does not exclude the presence of one or more other features, entities, steps, operations, elements, parts and/or groups thereof, or the addition of one or more other features, entities, steps, operations, elements, parts and/or groups thereof. As used herein, the term "and/or" includes any and all combination(s) of one or more of the items associated and listed.

It should be understood that although the terms such as "first", "second", "third" and the like can be used herein for describing various devices, elements, components and/or portions, they should not limit these devices, elements, components and/or portions. These terms are only used for distinguishing one device, element, component or portion from another device, element, component or portion. Therefore, a first device, element, component or portion discussed below may also be referred to as a second or third device, element, component or portion, without departing from the teaching of the present disclosure.

It should be understood that when an element is referred to as being "connected to another element" or "coupled to another element", the element can be connected to another element or coupled to another element directly or by means of an intermediate element. On the contrary, when an element is described as being "directly connected to another element" or "directly coupled to another element", there is no intermediate element.

It should be understood that in the present disclosure, when A and B are described as "A and B are in conduction", it should be understood that the electrical connection between A and B is realized, that is, electrical signals can be transmitted between A and B. Correspondingly, when A and B are described as "disconnect A from B in conduction", it should be understood as breaking the electrical connection between A and B, that is, electrical signals cannot be transmitted between A and B. However, at this situation, A and B may be physically disconnected from each other, or they may still be connected to each other, or at least one intermediate element may exist between A and B. In the above, A and B can be any suitable elements, components, portions, ports or signal terminals, and the like.

Unless otherwise defined, all terms (including both technical terms and scientific terms) used in the present disclosure have the same meaning as usually understood by one having ordinary skills in the art to which the present disclosure pertains. It should be further understood that the terms such as those defined in a commonly used dictionary should be construed as having the same meanings as they do in the related art and/or in the context of this specification, and should not be construed in an ideal sense or an overly formal sense, unless explicitly defined so in the present disclosure.

It should be understood that in the present disclosure, the descriptions with reference to the expressions such as "an embodiment", "some embodiments", "an exemplary embodiment", "a specific example" or "some examples" mean that specific features, structures, materials or characteristics described in combination with the exemplary embodiment(s) or example(s) are comprised in at least one exemplary embodiment or example of the present disclosure. Therefore, the schematic descriptions of the above expressions are not necessarily directed only at the same exemplary embodiment(s) or example(s) in the present disclosure. Instead, the described specific features, structures, materials or characteristics can be combined in any one or more exemplary embodiments or examples in any suitable ways. That is, where no contradiction is introduced, the different exemplary embodiments or examples described in the present disclosure, as well as the features of the different exemplary embodiments or examples described in the present disclosure, can be combined.

It should be understood that the steps in the method described in the present disclosure are all exemplary, and they do not necessarily have to be performed in the order as listed, but one or more of these steps can be performed in a different order or simultaneously according to actual conditions. In addition, according to actual conditions, the method described in the present disclosure may further include other additional steps.

For clarity, some techniques, structures and materials commonly known in the art to which the present disclosure pertains will not be described in detail so as to avoid redundancy and tediousness of the present disclosure.

Referring to FIG. 1, it shows a pixel circuit known in the related art. As shown in FIG. 1, the pixel circuit 10 includes eight transistors M1, M2, M3, M4, M5, M6, M7 and M8, a capacitor Cst and a light-emitting device L. As a non-limiting example, the light-emitting device L may be an organic light-emitting diode (also referred to as an OLED). A first voltage terminal VDD and a second voltage terminal VSS are used to supply power to the pixel circuit 10. With the cooperation of the various signals provided by an initialization voltage signal terminal Vinit, a pixel circuit reset signal terminal P_Reset, a first gate driving signal terminal Gate, a second gate driving signal terminal Gaten, a third gate driving signal terminal Gatep and a light emission control signal terminal EM, the light-emitting device L can be lit at a suitable timing sequence, thereby realizing the driving of the pixel circuit 10.

Figure 2:
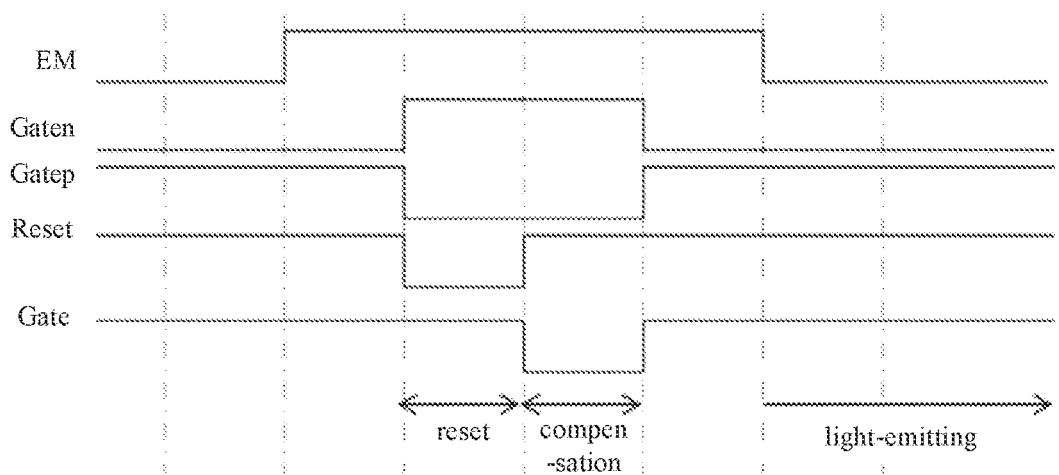
FIG. 2 shows the timing sequences of the control signals applied to various signal terminals of the pixel circuit shown in FIG. 1 in the form of a timing sequence diagram.

Referring to FIG. 2, it shows the timing sequences of the control signals applied to the various signal terminals of the pixel circuit 10 shown in FIG. 1 in the form of a timing sequence diagram. As shown in FIG. 2, when driving the pixel circuit 10, three different gate driving signals need to be respectively applied to the first gate driving signal terminal Gate, the second gate driving signal terminal Gaten and the third gate driving signal terminal Gatep. Therefore, if a normal GOA circuit is used to provide gate driving signals to the pixel circuit 10 shown in FIG. 1, three different GOA circuits are required, so that the occupied area of the GOA circuits is larger, and the width of the panel bezel is also larger.

Figure 3:
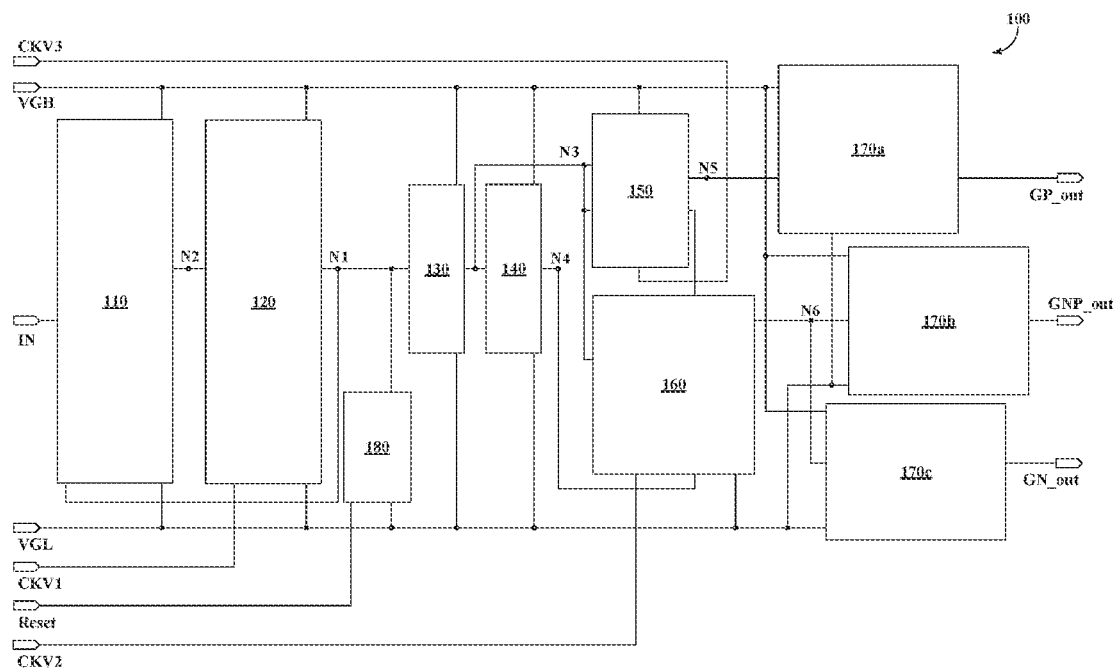
FIG. 3 schematically shows, in the form of a block diagram form, a shift register circuit according to an exemplary embodiment of the present disclosure.

Referring to FIG. 3, it schematically shows the structure of the shift register circuit 100 according to an exemplary embodiment of the present disclosure in the form of a block diagram. As shown in FIG. 3, the shift register circuit 100 may include: an input circuit 110, a first control circuit 120, a second control circuit 130, a third control circuit 140, a fourth control circuit 150, a fifth control circuit 160, a first output circuit 170a, a second output circuit 170b, a third output circuit 170c, and a reset circuit 180. The input circuit 110 is configured to: in response to at least one of an input terminal IN providing an input pulse and a first node N1 being at a low potential, bring a second node N2 into conduction with a high-potential voltage terminal VGH providing a high-potential voltage signal, and in response to both the input terminal IN and the first node N1 being at a high potential, bring the second node N2 into conduction with a low-potential voltage terminal VGL providing a low-potential voltage signal. The first control circuit 120 is configured to: in response to at least one of a first clock signal terminal CKV1 providing a first clock signal and the second node N2 being at a low potential, bring the first node N1 into conduction with the high-potential voltage terminal VGH, and in response to both the first clock signal terminal CKV1 and the second node N2 being at a high potential, bring the first node N1 into conduction with the low-potential voltage terminal VGL. The second control circuit 120 is configured to: in response to the first node N1 being at a high potential, bring a third node N3 into conduction with the low-potential voltage terminal VGL, and in response to the first node N1 being at a low potential, bring the third node N3 into conduction with the high-potential voltage terminal VGH. The third control circuit 140 is configured to: in response to the third node N3 being at a high potential, bring a fourth node N4 into conduction with the low-potential voltage terminal VGL, and in response to the third node N3 being at a low potential, bring the fourth node N4 into conduction with the high-potential voltage terminal VGH. The fourth control circuit 150 is configured to: in response to the third node N3 being at a low potential and the fourth node N4 being at a high potential, bring a fifth node N5 into conduction with the high-potential voltage terminal VGH, and in response to the third node N3 being at a high potential and the fourth node N4 being at a low potential, bring the fifth node N5 into conduction with a second clock signal terminal CKV3 providing a second clock signal. The fifth control circuit 160 is configured to: in response to the third node N3 being at a low potential and the fourth node N4 being at a high potential, bring a sixth node N6 into conduction with the low-potential voltage terminal VGL, and in response to the third node N3 being at a high potential and the fourth node N4 being at a low potential, bring the sixth node N6 into conduction with the first clock signal terminal CKV1. The first output circuit 170a is configured to: in response to the fifth node N5 being at a low potential, bring a first output terminal GP_out providing a first output signal into conduction with the low-potential voltage terminal VGL, and in response to the fifth node N5 being at a high potential, bring the first output terminal GP_out into conduction with the high-potential voltage terminal VGH. The second output circuit 170b is configured to: in response to the sixth node N6 being at the low potential, bring a second output terminal GNP_out providing a second output signal into conduction with the high-potential voltage terminal VGH, and in response to the sixth node N6 being at the high potential, bring the second output terminal GNP_out into conduction with the low-potential voltage terminal VGL. The third output circuit 170c is configured to: in response to the sixth node N6 being at a low potential, bring a third output terminal GN_out providing a third output signal into conduction with the low-potential voltage terminal VGL, and in response to the sixth node N6 being at a high potential, bring the third output terminal GN_out into conduction with the high-potential voltage terminal VGH. The reset circuit 180 is configured to: in response to a reset terminal Reset providing a reset pulse being at a high potential, bring the first node N1 into conduction with the low-potential voltage terminal VGL. It should be noted that the term "high potential" used in the present disclosure refers to a potential at which a circuit element such as an N-type transistor is enabled or turned on, and a circuit element such as a P-type transistor is disabled or turned off; and the term "low potential" as used in the present disclosure refers to a potential at which a circuit element such as an N-type transistor is disabled or turned off, and a circuit element such as a P-type transistor is enabled or turned on. In addition, it should be understood that in the present disclosure, a high potential or a low potential is not intended to refer to a specific potential, but may include a range of potentials. Additionally, in the present disclosure, the terms "level," "voltage level," and "potential" may be used interchangeably.

Figure 4:
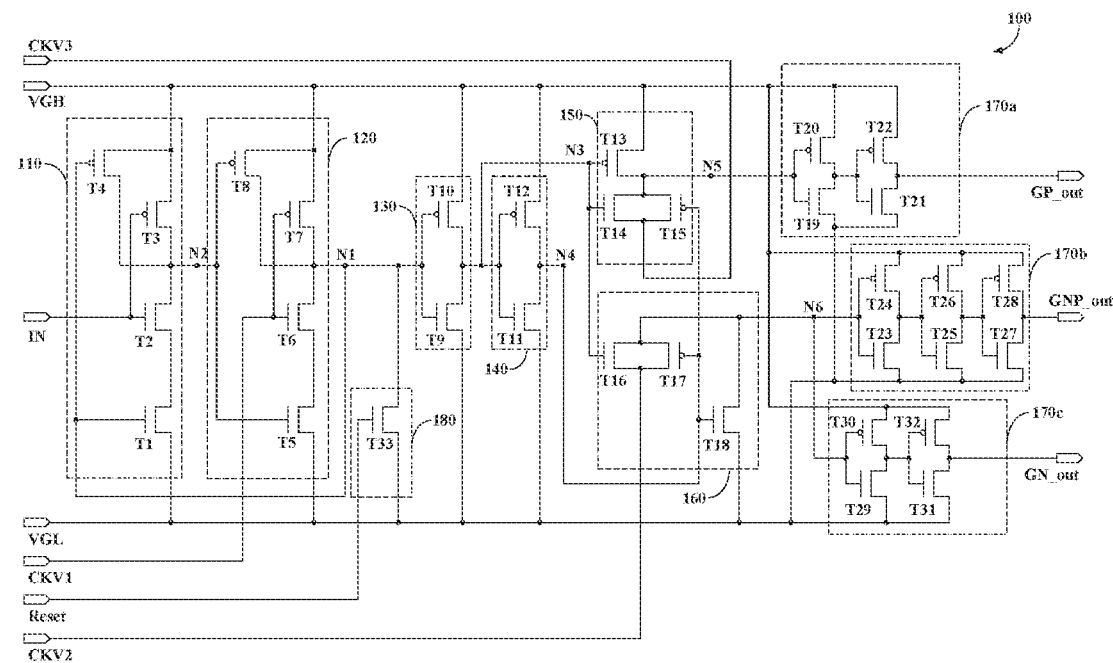
FIG. 4 schematically shows an exemplary circuit structure of the shift register circuit shown in FIG. 3.

Referring to FIG. 4, it schematically shows an exemplary circuit of the shift register circuit 100 shown in FIG. 3. The exemplary circuit structure of the shift register circuit 100 will be described in detail hereinafter, referring to FIG. 4 and in conjunction with reference to FIG. 3.

As shown in FIG. 4, the input circuit 110 may include a first transistor T1, a second transistor T2, a third transistor T3 and a fourth transistor T4, wherein the first transistor T1 and the second transistor T2 are N-type transistors, and the third transistor T3 and the fourth transistor T4 are P-type transistors. A first electrode of the first transistor T1 is connected to the low-potential voltage terminal VGL, a control electrode thereof is connected to the first node N1, and the second electrode thereof is connected to a first electrode of the second transistor T2. The first electrode of the second transistor T2 is connected to the second electrode of the first transistor T1, the second electrode thereof is connected to the second node N2, and the control electrode thereof is connected to the input terminal IN. A first electrode of the third transistor T3 is connected to the second node N2, a second electrode thereof is connected to the high-potential voltage terminal VGH, and the control electrode thereof is connected to the input terminal IN. A first electrode of the fourth transistor T4 is connected to the second node N2, a second electrode thereof is connected to the high-potential voltage terminal VGH, and a control electrode thereof is connected to the first node N1.

The first control circuit 120 may include a fifth transistor T5, a sixth transistor T6, a seventh transistor T7, and an eighth transistor T8, wherein the fifth transistor T5 and the sixth transistor T6 are N-type transistors, and the seventh transistor T7 and the eighth transistor T8 are P-type transistors. A first electrode of the fifth transistor T5 is connected to the low-potential voltage terminal VGL, a control electrode thereof is connected to the second node N2, and a second electrode thereof is connected to a first electrode of the sixth transistor T6. The first electrode of the sixth transistor T6 is connected to the second electrode of the fifth transistor T5, a second electrode thereof is connected to the first node N1, and a control electrode thereof is connected to the first clock signal terminal CKV1. A first electrode of the seventh transistor T7 is connected to the first node N1, a second electrode thereof is connected to the high-potential voltage terminal VGH, and a control electrode thereof is connected to the first clock signal terminal CKV1. A first electrode of the eighth transistor T8 is connected to the first node N1, a second electrode thereof is connected to the high-potential voltage terminal VGH, and a control electrode thereof is connected to the second node N2.

The second control circuit 130 may include a ninth transistor T9 and a tenth transistor T10, wherein the ninth transistor T9 is an N-type transistor, and the tenth transistor T10 is a P-type transistor. A first electrode of the ninth transistor T9 is connected to the low-potential voltage terminal VGL, a second electrode thereof is connected to the third node N3, and a control electrode thereof is connected to the first node N1. A first electrode of the tenth transistor T10 is connected to the third node N3, a second electrode thereof is connected to the high-potential voltage terminal VGH, and a control electrode thereof is connected to the first node N1.

The third control circuit 140 may include an eleventh transistor T11 and a twelfth transistor T12, wherein the eleventh transistor T11 is an N-type transistor, and the twelfth transistor T12 is a P-type transistor. A first electrode of the eleventh transistor T11 is connected to the low-potential voltage terminal VGL, a second electrode thereof is connected to the fourth node N4, and a control electrode thereof is connected to the third node N3. A first electrode of the twelfth transistor T12 is connected to the fourth node N4, a second electrode thereof is connected to the high-potential voltage terminal VGH, and a control electrode thereof is connected to the third node N3.

The fourth control circuit 150 may include a thirteenth transistor T13, a fourteenth transistor T14, and a fifteenth transistor T15, wherein the thirteenth transistor T13 and the fifteenth transistor T15 are P-type transistors, and the fourteenth transistor T14 is an N-type transistor. A first electrode of the thirteenth transistor T13 is connected to the fifth node N5, a second electrode thereof is connected to the high-potential voltage terminal VGH, and a control electrode thereof is connected to the third node N3. A first electrode of the fourteenth transistor T14 is connected to the third clock signal terminal CKV3, a second electrode thereof is connected to the fifth node N5, and a control electrode thereof is connected to the third node N3. A first electrode of the fifteenth transistor T15 is connected to the third clock signal terminal CKV3, a second electrode thereof is connected to the fifth node N5, and a control electrode thereof is connected to the fourth node N4.

The fifth control circuit 160 may include a sixteenth transistor T16, a seventeenth transistor T17 and an eighteenth transistor T18, wherein the sixteenth transistor T16 and the eighteenth transistor T18 are N-type transistors, and the seventeenth transistor T17 is a P-type transistor. A first electrode of the sixteenth transistor T16 is connected to the second clock signal terminal CKV2, a second electrode thereof is connected to the sixth node N6, and a control electrode thereof is connected to the third node N3. A first electrode of the seventeenth transistor T17 is connected to the second clock signal terminal CKV2, a second electrode thereof is connected to the sixth node N6, and a control electrode thereof is connected to the fourth node N4. A first electrode of the eighteenth transistor T18 is connected to the low-potential voltage terminal VGL, a second electrode thereof is connected to the sixth node N6, and a control electrode thereof is connected to the fourth node N4.

The first output circuit 170a may include a nineteenth transistor T19, a twentieth transistor T20, a twenty-first transistor T21 and a twenty-second transistor T22, wherein the nineteenth transistor T19 and the twenty-first transistor T21 are N-type The transistors, the twentieth transistor T20 and the twenty-second transistor T22 are P-type transistors. A first electrode of the nineteenth transistor T19 is connected to the low-potential voltage terminal VGL, a control electrode thereof is connected to the fifth node N5, and a second electrode thereof is connected to a first electrode of the twentieth transistor T20. A first electrode of the twentieth transistor T20 is connected to the second electrode of the nineteenth transistor T19, a second electrode thereof is connected to the high-potential voltage terminal VGH, and a control electrode thereof is connected to the fifth node N5. A first electrode of the twenty-first transistor T21 is connected to the low-potential voltage terminal VGL, a second electrode thereof is connected to a first output terminal GP_out, and a control electrode thereof is connected to the second electrode of the nineteenth transistor T19. A first electrode of the twenty-second transistor T22 is connected to the first output terminal GP_out, a second electrode thereof is connected to the high-potential voltage terminal VGH, and a control electrode thereof is connected to the control electrode of the twenty-first transistor T21.

The second output circuit 170b may include a twenty-third transistor T23, a twenty-fourth transistor T24, a twenty-fifth transistor T25, a twenty-sixth transistor T26, a twenty-seventh transistor T27, and a twenty-eighth transistor T28, wherein the twenty-third transistor T23, the twenty-fifth transistor T25 and the twenty-seventh transistor T27 are N-type transistors, the twenty-fourth transistor T24, the twenty-sixth transistor T26 and the twenty-eighth transistor T28 are P-type transistors. A first electrode of the twenty-third transistor T23 is connected to the low-potential voltage terminal VGL, a control electrode thereof is connected to the sixth node N6, and the second electrode thereof is connected to a first electrode of the twenty-fourth transistor T24. A first electrode of the twenty-fourth transistor T24 is connected to the second electrode of the twenty-third transistor T23, a second electrode thereof is connected to the high-potential voltage terminal VGH, and a control electrode thereof is connected to the sixth node N6. A first electrode of the twenty-fifth transistor T25 is connected to the low-potential voltage terminal VGL, a control electrode thereof is connected to the second electrode of the twenty-third transistor T23, and a second electrode thereof is connected to a first electrode of the twenty-sixth transistor T26. The first electrode of the twenty-sixth transistor T26 is connected to the second electrode of the twenty-fifth transistor T25, a second electrode thereof is connected to the high-potential voltage terminal VGH, and a control electrode thereof is connected to the control electrode of the twenty-fifth transistor T25. A first electrode of the twenty-seventh transistor T27 is connected to the low-potential voltage terminal VGL, a second electrode thereof is connected to a second output terminal GNP_out, and a control electrode thereof is connected to the second electrode of the twenty-fifth transistor T25. A first electrode of the twenty-eighth transistor T28 is connected to the second output terminal GNP_out, a second electrode thereof is connected to the high-potential voltage terminal VGH, and a control electrode thereof is connected to the control electrode of the twenty-seventh transistor T27.

The third output circuit 170c may include a twenty-ninth transistor T29, a thirtieth transistor T30, a thirty-first transistor T31, and a thirty-second transistor T32, wherein the twenty-ninth transistor T29 and the thirty-first transistor T31 are N-type transistors, the thirtieth transistor T30 and the thirty-second transistor T32 are P-type transistors. A first electrode of the twenty-ninth transistor T29 is connected to the low-potential voltage terminal VGL, a control electrode thereof is connected to the sixth node N6, and a second electrode thereof is connected to a first electrode of the thirtieth transistor T30. The first electrode of the thirtieth transistor T30 is connected to the second electrode of the twenty-ninth transistor T29, a second electrode thereof is connected to the high-potential voltage terminal VGH, and a control electrode thereof is connected to the sixth node N6. A first electrode of the thirty-first transistor T31 is connected to the low-potential voltage terminal VGL, a second electrode thereof is connected to a third output terminal GN_out, and a control electrode thereof is connected to the second electrode of the twenty-ninth transistor T29. A first electrode of the thirty-second transistor T32 is connected to the third output terminal GN_out, a second electrode thereof is connected to the high-potential voltage terminal VGH, and a control electrode thereof is connected to the control electrode of the thirty-first transistor T31.

The reset circuit 180 may include a thirty-third transistor T33, which is an N-type transistor. A first electrode of the thirty-third transistor T33 is connected to the low-potential voltage terminal VGL, a second electrode thereof is connected to the first node N1, and a control electrode thereof is connected to the reset terminal Reset.

In the exemplary embodiment of the present disclosure shown in FIG. 4, only the exemplary circuit structures of the shift register circuit 100 as well as the input circuit 110, the first control circuit 120, the second control circuit 130, the third control circuit 140, the fourth control circuit 150, the fifth control circuit 160, the first output circuit 170a, the second output circuit 170b, the third output circuit 170c and the reset circuit 180 included therein are shown. In addition, in some other exemplary embodiments not shown in the present disclosure, the shift register circuit 100 may also not include the reset circuit 180.

It should also be understood that the implementation of each of the above circuits is not limited to this, but can be achieved by any suitable implementation, as long as the function of each of the circuits described in the present disclosure can be achieved.

It should be understood that the transistors used in each exemplary embodiment of the present disclosure can be thin film transistors or field effect transistors or other devices having the same characteristics. In each exemplary embodiment, each transistor is typically fabricated such that its source and drain can be used interchangeably, so its source and drain are not essentially different from each other in the description of the connection relationship. In each exemplary embodiment of the present disclosure, to distinguish between the source and the drain of a transistor, one electrode thereof is referred to as a first electrode, the other electrode is referred to as a second electrode, and the gate is referred to as a control electrode. It can be easily understood that given an N-type transistor, the turn-on voltage of a control electrode (i.e. gate) has a high potential, and the turn-off voltage of the control electrode has a low potential. That is to say, when the control electrode of the N-type transistor is at a high potential, the first electrode and the second electrode thereof are in conduction, and when the control electrode of the N-type transistor is at a low potential, the first electrode is disconnected from the second electrode in conduction. It can also be easily understood that, in the case of a P-type transistor, the turn-on voltage of a control electrode (ie, the gate) has a low potential, and the turn-off voltage of the control electrode has a high potential. That is to say, when the control electrode of the P-type transistor is at a low potential, the first electrode and the second electrode thereof are in conduction, and when the control electrode of the P-type transistor is at a high potential, the first electrode is disconnected from the second electrode in conduction.

Figure 5:
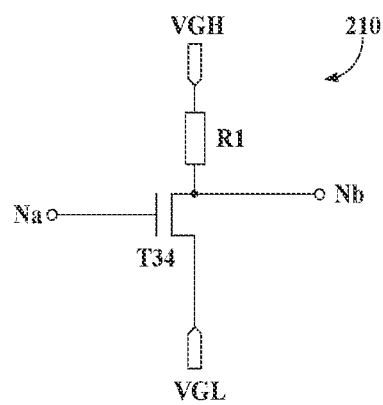
FIG. 5 schematically shows another exemplary circuit that can be used to implement the second control circuit and/or the third control circuit shown in FIG. 3.

Referring to FIG. 5, it schematically shows another exemplary circuit that may be used to implement the second control circuit 130 and/or the third control circuit 140 shown in FIG. 3. As shown in FIG. 5, the circuit 210 may include a thirty-fourth transistor T34 and a first resistor R1, wherein the thirty-fourth transistor T34 is an N-type transistor. A first electrode of the thirty-fourth transistor T34 is connected to the low-potential voltage terminal VGL, a second electrode thereof is connected to a first electrode of the first resistor R1 and connected to a node Nb, and a control electrode thereof is connected to a node Na. The first electrode of the first resistor R1 is connected to the second electrode of the thirty-fourth transistor T34, and a second electrode thereof is connected to the high-potential voltage terminal VGH. When the node Na is at a high potential, the thirty-fourth transistor T34 is turned on, so that the node Nb and the low-potential voltage terminal VGL are in conduction, and thus the node Nb is at a low potential; when the node Na is at a low potential, the thirty-fourth transistor T34 is turned off to disconnect the node Nb from the low-potential voltage terminal VGL in conduction. At this time, the first resistor R1 transmits the high-potential voltage signal of the high-potential voltage terminal VGH to the node Nb, thus making the node Nb at a high potential.

It can be easily understood that when the circuit 210 shown in FIG. 5 is applied to the second control circuit 130 shown in FIG. 3, the nodes Na and Nb shown in FIG. 5 correspond to the nodes N1 and N3 shown in FIG. 3, respectively. Furthermore, when the circuit 210 shown in FIG. 5 is applied to the third control circuit 140 shown in FIG. 3, the nodes Na and Nb shown in FIG. 5 correspond to the nodes N3 and N4 shown in FIG. 3, respectively.

Figure 6:
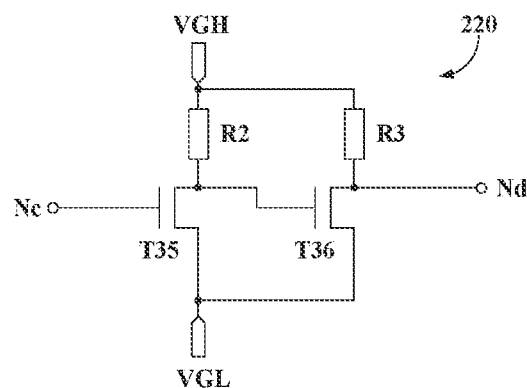
FIG. 6 schematically shows another exemplary circuit that can be used to implement the first output circuit and/or the third output circuit shown in FIG. 3.

Referring to FIG. 6, it schematically shows another exemplary circuit that may be used to implement the first output circuit 170a and/or the third output circuit 170c shown in FIG. 3. As shown in FIG. 6, the circuit 220 may include a thirty-fifth transistor T35, a thirty-sixth transistor T36, a second resistor R2 and a third resistor R3, wherein the thirty-fifth transistor T35 and the thirty-sixth transistor T36 are N-type transistors. A first electrode of the thirty-fifth transistor T35 is connected to the low-potential voltage terminal VGL, a second electrode thereof is connected to a first electrode of the second resistor R2, and a control electrode thereof is connected to the node Nc. The first electrode of the second resistor R2 is connected to the second electrode of the thirty-fifth transistor T35, a second electrode thereof is connected to the high-potential voltage terminal VGH. A first electrode of the thirty-sixth transistor T36 is connected to the low-potential voltage terminal VGL, a second electrode thereof is connected to the node Nd, and a control electrode thereof is connected to the second electrode of the thirty-fifth transistor T35. A first electrode of the third resistor R3 is connected to the node Nd, and a second electrode thereof is connected to the high-potential voltage terminal VGH. When the node Nc is at a high potential, the thirty-fifth transistor T35 is turned on, so that the control electrode of the thirty-sixth transistor T36 is into conduction with the low-potential voltage terminal VGL, and thus is at a low potential. Therefore, the thirty-sixth transistor T36 is turned off. At this time, the third resistor R3 transmits the high-potential voltage signal of the high-potential voltage terminal VGH to the node Nd, so that the node Nd is at a high potential. When the node Nc is at a low potential, the thirty-fifth transistor T35 is turned off, and the third resistor R3 transmits the high-potential voltage signal of the high-potential voltage terminal VGH to the control electrode of the thirty-sixth transistor T36, so that the thirty-sixth transistor T36 is turned on. Therefore, the node Nd and the low-potential voltage terminal VGL are in conduction, so that the node Nd is at a low potential.

It can be easily understood that when the circuit 220 shown in FIG. 6 is applied to the first output circuit 170a shown in FIG. 3, the nodes Nc and Nd shown in FIG. 6 correspond to the node N5 and the first output terminal GP_out shown in FIG. 3, respectively. Furthermore, when the circuit 220 shown in FIG. 6 is applied to the third output circuit 170c shown in FIG. 3, the nodes Nc and Nd shown in FIG. 6 correspond to the node N6 and the third output terminal GN_out shown in FIG. 3, respectively.

Figure 7:
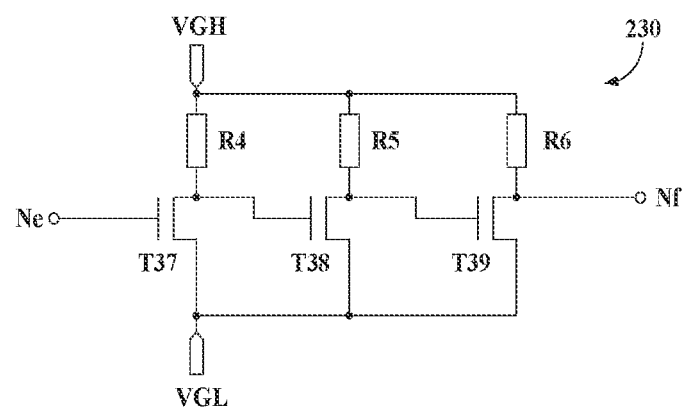
FIG. 7 schematically shows another exemplary circuit that can be used to implement the second output circuit shown in FIG. 3.

Referring to FIG. 7, it schematically shows another exemplary circuit that may be used to implement the second output circuit 170b shown in FIG. 3. As shown in FIG. 7, the circuit 230 may include a thirty-seventh transistor T37, a thirty-eighth transistor T38, a thirty-ninth transistor T39, a fourth resistor R4, a fifth resistor R5, and a sixth resistor R6, wherein the thirty-seventh transistor T37, the thirty-eighth transistor T38 and the thirty-ninth transistor T39 are N-type transistors. A first electrode of the thirty-seventh transistor T37 is connected to the low-potential voltage terminal VGL, a second electrode thereof is connected to a first electrode of the fourth resistor R4, and a control electrode thereof is connected to a node Ne. The first electrode of the fourth resistor R4 is connected to the second electrode of the thirty-seventh transistor T37, and a second electrode thereof is connected to the high-potential voltage terminal VGH. A first electrode of the thirty-eighth transistor T38 is connected to the low-potential voltage terminal VGL, a second electrode thereof is connected to a first electrode of the fifth resistor R5, and a control electrode thereof is connected to the second electrode of the thirty-seventh transistor T37. The first electrode of the fifth resistor R5 is connected to the second electrode of the thirty-eighth transistor T38, and a second electrode thereof is connected to the high-potential voltage terminal VGH. A first electrode of the thirty-ninth transistor T39 is connected to the low-potential voltage terminal VGL, a second electrode thereof is connected to a node Nf, and a control electrode thereof is connected to the second electrode of the thirty-eighth transistor T38. A first electrode of the sixth resistor R6 is connected to the node Nf, and a second electrode thereof is connected to the high-potential voltage terminal VGH. According to the previous analysis, when the node Ne is at a high potential, the thirty-seventh transistor T37 is turned on, and the thirty-eighth transistor T38 is turned off, so the thirty-ninth transistor T39 is turned on, and thus making the node Nf and the low-potential voltage terminal VGL be in conduction, so that the node Nf is at a low potential; when the node Ne is at a low potential, the thirty-seventh transistor T37 is turned off, and the thirty-eighth transistor T38 is turned on, so the thirty-ninth transistor T39 is turned off. At this time, the conduction between the node Nf and the low-potential voltage terminal VGL is disconnected, and the sixth resistor R6 transmits the high-potential voltage signal of the high-potential voltage terminal VGH to the node Nf, thereby making the node Nf at a high potential. In addition, it can be easily understood that when the circuit 230 shown in FIG. 7 is applied to the second output circuit 170b shown in FIG. 3, the nodes Ne and Nf shown in FIG. 7 correspond to the node N6 and the second output terminal GNP_out shown in FIG. 3, respectively.

With the circuits shown in FIGS. 5 to 7, the corresponding control circuits and/or output circuits in the shift register circuit 100 shown in FIG. 3 can be implemented with fewer components (for example, transistors), so that the occupied area of circuits can be further reduced, and thus the width of the panel bezel can be further reduced.

It should be understood that, under the teachings of the present disclosure, those having the ordinary skills in the art may add or remove one or more components in the exemplary circuit of each exemplary embodiment of the present disclosure, without departing from the spirit and scope of the present disclosure. Furthermore, without departing from technical principles, other embodiments are conceivable for each of the circuits taught in the above-described exemplary embodiments.

Figure 8:
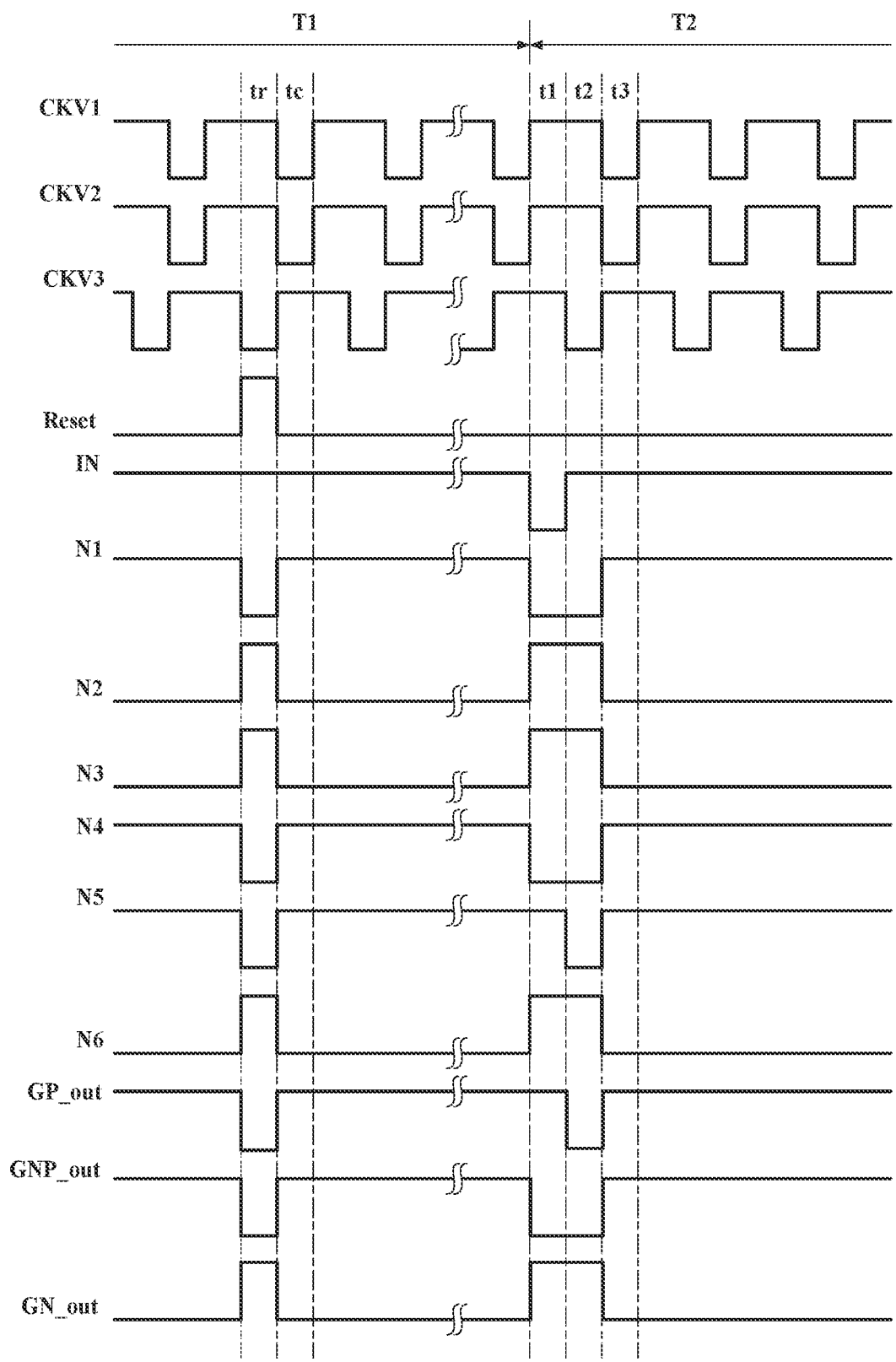
FIG. 8 schematically shows the timing sequence of signals applicable to various signal terminals of the shift register circuit shown in FIG. 3 and FIG. 4.

Referring to FIG. 8, it schematically shows the signal timing sequences applicable to various signal terminals of the shift register circuit 100 shown in FIG. 3 and FIG. 4. As shown in FIG. 8, the first clock signal received from the first clock signal terminal CKV1, the second clock signal received from the second clock signal terminal CKV2, and the third clock signal received from the third clock signal terminal CKV3 have the same period, and have a duty ratio of 2/3. The first clock signal and the second clock signal have the same timing sequence, and the third clock signal is delayed by 2/3 period in timing sequence when compared with the first clock signal. As a non-limiting example, the input pulse received from the input terminal IN may be a negative pulse signal that changes from a high potential to a low potential, and then changes from a low potential to a high potential, and the pulse width thereof may be 1/3 of the period of each clock signal. The operation of the shift register circuit 100 shown in FIG. 4 will be described in detail hereinafter with reference to FIG. 8. It should be understood that, in the whole working cycle of the shift register circuit 100, the low-potential voltage terminal VGL is always applied with a low-potential voltage signal, and the high-potential voltage terminal VGH is always applied with a high-potential voltage signal.

In addition, "1" represents a high potential and "0" represents a low potential hereinafter. Also, the expressions "=0" and "=1" are used to represent the potential at which a node and/or a signal terminal is. For example, N1=0 means that the node N1 is at a low potential, N1=1 means that the node N1 is at a high potential, and so on.

As shown in FIG. 8, the timing sequence of the shift register circuit 100 of FIG. 4 includes an initialization phase T1 and an operation phase T2. During the initialization phase T1 and the operation phase T2, VGH=1, VGL=0, and the first, second and third clock signals received at the first, second and third clock signal terminals CKV1, CKV2 and CKV3 have respective clock pulses. During the initialization phase T1, the shift register circuit 100 performs a reset operation based on the reset pulse received from the reset terminal Reset; and during the operation phase T2, the shift register circuit 100 generates the output signals that can be used as gate-on pulses based on the input pulse received from the input terminal IN and the clock signals received from the various clock signal terminals.

During the initialization phase T1, and before the time period tr, Reset=0, IN=1, N1=1. Because Reset=0, the thirty-third transistor T33 is turned off, so that the first node N1 and the low-potential voltage terminal VGL are not in conduction. Because IN=1, the second transistor T2 is turned on, and the third transistor T3 is turned off. Because N1=1, the first transistor T1 is turned on, and the fourth transistor T4 is turned off, so that the second node N2 is in conduction with the low-potential voltage terminal VGL, and thus N2=0. Because N2=0, the fifth transistor T5 is turned off, and the eighth transistor T8 is turned on. At this time, regardless of whether CKV1=1 or CKV1=0, the first node N1 is in conduction with the high-potential voltage terminal VGH, and thus keeping N1=1.

Because N1=1, the ninth transistor T9 is turned on, and the tenth transistor T10 is turned off, so that the third node N3 and the low-potential voltage terminal VGL are in conduction, that is, N3=0. Because N3=0, the eleventh transistor T11 is turned off, and the twelfth transistor T12 is turned on, so that the fourth node N4 and the high-potential voltage terminal VGH are in conduction, that is, N4=1.

Because N3=0 and N4=1, the thirteenth transistor T13 is turned on, and the fourteenth transistor T14 and the fifteenth transistor T15 are turned off, so that the fifth node N5 is in conduction with the high-potential voltage terminal VGH, that is, N5=1. Because N3=0 and N4=1, the sixteenth transistor T16 and the seventeenth transistor T17 are turned off, and the eighteenth transistor T18 is turned on, so that the sixth node N6 is in conduction with the low-potential voltage terminal VGL, that is, N6=0.

Because N5=1, the nineteenth transistor T19 and the twenty-second transistor T22 are turned on, and the twentieth transistor T20 and the twenty-first transistor T21 are turned off, so that the first output terminal GP_out is in conduction with the high-potential voltage terminal VGH, that is, GP_out=1. Because N6=0, the twenty-fourth transistor T24, the twenty-fifth transistor T25 and the twenty-eighth transistor T28 are turned on, and the twenty-third transistor T23, the twenty-sixth transistor T26 and the twenty-seventh transistor T27 are turned off, so that the second output terminal GNP_out is in conduction with the high-potential voltage terminal VGH, that is, GNP_out=1. Because N6=0, the thirtieth transistor T30 and the thirty-first transistor T31 are turned on, and the twenty-ninth transistor T29 and the thirty-second transistor T32 are turned off, so that the third output terminal GN_out is in conduction with the low-potential voltage terminal VGL, that is, GN_out=0.

During the initialization phase T1, and during the time period tr, Reset=1, IN=1. Because Reset=1, the thirty-third transistor T33 is turned on, so that the first node N1 and the low-potential voltage terminal VGL are in conduction, that is, N1=0. Because IN=1, the second transistor T2 is kept on, and the third transistor T3 is kept off. Because N1=0, the first transistor T1 is turned off, and the fourth transistor T4 is turned on, so that the second node N2 and the high-potential voltage terminal VGH are in conduction, and thus N2=1. Because N2=1, the fifth transistor T5 is turned on, and the eighth transistor T8 is turned off. At this time, because CKV1=1, the sixth transistor T6 is turned on, and the seventh transistor T7 is turned off, so that the first node N1 is in conduction with the low-potential voltage terminal VGL to keep N1=0.

Because N1=0, the ninth transistor T9 is turned off, and the tenth transistor T10 is turned on, so that the third node N3 is in conduction with the high-potential voltage terminal VGH, that is, N3=1. Because N3=1, the eleventh transistor T11 is turned on, and the twelfth transistor T12 is turned off, so that the fourth node N4 is in conduction with the low-potential voltage terminal VGL, that is, N4=0.

Because N3=1 and N4=0, the thirteenth transistor T13 is turned off, and the fourteenth transistor 14 and the fifteenth transistor T15 are turned on, so that the fifth node N5 is in conduction with the third clock signal terminal CKV3. At this time, CKV3=0, so N5=0. Because N3=1 and N4=0, the sixteenth transistor T16 and the seventeenth transistor T17 are turned on, and the eighteenth transistor T18 is turned off, so that the sixth node N6 is in conduction with the second clock signal terminal CKV2. At this time, CKV2=1, so N6=1.

Because N5=0, the nineteenth transistor T19 and the twenty-second transistor T22 are turned off, and the twentieth transistor T20 and the twenty-first transistor T21 are turned on, so that the first output terminal GP_out is in conduction with the low-potential voltage terminal VGL, that is, GP_out=0. Because N6=1, the twenty-fourth transistor T24, the twenty-fifth transistor T25 and the twenty-eighth transistor T28 are turned off, and the twenty-third transistor T23, the twenty-sixth transistor T26 and the twenty-seventh transistor T27 are turned on, so that the second output terminal GNP_out is in conduction with the low-potential voltage terminal VGL, that is, GNP_out=0. Because N6=1, the thirtieth transistor T30 and the thirty-first transistor T31 are turned off, and the twenty-ninth transistor T29 and the thirty-second transistor T32 are turned on, so that the third output terminal GN_out is in conduction with the high-potential voltage terminal VGH, that is, GN_out=1.

During the initialization phase T1, and during the time period tc, Reset=0, IN=1. Because Reset=0, the thirty-third transistor T33 is turned off, and the conduction between the first node N1 and the low-potential voltage terminal VGL is disconnected; at the same time, because CKV1=0, the sixth transistor T6 is turned off, and the seventh transistor T7 is turned on. At this time, regardless of whether N2=1 or N2=0, the first node N1 is in conduction with the high-potential voltage terminal VGH, that is, N1=1. Because IN=1, the second transistor T2 is turned on, and the third transistor T3 is turned off. Because N1=1, the first transistor T1 is turned on, and the fourth transistor T4 is turned off, so that the second node N2 is in conduction with the low-potential voltage terminal VGL, and thus, the second node N2 becomes a low potential, that is, N2=0. Because N2=0, the fifth transistor T5 is turned off, and the eighth transistor T8 is turned on. At this time, regardless of whether CKV1=1 or CKV1=0, the first node N1 is in conduction with the high-potential voltage terminal VGH, thus keeping N1=1. Since N1=1, similarly to the situation before the time period tr, N3=0, N4=1, N5=1, N6=0, and thus GP_out=1, GNP_out=1, GN_out=0

During the initialization phase T1 and after the time period tc, since Reset=0, IN=1, N1=1 are kept, the potentials at the nodes N2, N3, N4, N5, N6 and the output terminals GP_out, GNP_out and GN_out are unchanged.

During the operation phase T2, Reset remains at 0, so the thirty-third transistor T33 remains off. During the time period t1, IN=0. Because IN=0, the second transistor T2 is turned off, and the third transistor T3 is turned on, so that the second node N2 is in conduction with the high-potential voltage terminal VGH, that is, N2=1. Because N2=1, the fifth transistor T5 is turned on, and the eighth transistor T8 is turned off. At the same time, because CKV1=1, the sixth transistor T6 is turned on, and the seventh transistor T7 is turned off, so that the first node N1 is in conduction with the low-potential voltage terminal VGL, that is, N1=0.

Same analysis as above, N1=0, so N3=1, N4=0. Because N3=1 and N4=0, the thirteenth transistor T13 is turned off, and the fourteenth transistor 14 and the fifteenth transistor T15 are turned on, so that the fifth node N5 is in conduction with the third clock signal terminal CKV3. At this time, CKV3=1, so N5=1. Because N3=1 and N4=0, the sixteenth transistor T16 and the seventeenth transistor T17 are turned on, and the eighteenth transistor T18 is turned off, so that the sixth node N6 is in conduction with the second clock signal terminal CKV2. At this time, CKV2=1, so N6=1. Same analysis as above, because N5=1, N6=1, so GP_out=1, GNP_out=0, GN_out=1.

During the time period t2, IN=1. Because IN=1, the second transistor T2 is turned on, and the third transistor T3 is turned off. At this time, N1=0, so the first transistor T1 is turned off, and the fourth transistor T4 is turned on, so that the second node N2 is kept in conduction with the high-potential voltage terminal VGH, that is, N2=1 is kept. Because N2=1, and CKV1 is kept at 1 at this time, thus, the first node N1 is in conduction with the low-potential voltage terminal VGL, that is, N1=0 is kept.

Same analysis as above, N1=0, so N3=1, N4=0. Because N3=1 and N4=0, the fifth node N5 is in conduction with the third clock signal terminal CKV3. At this time, CKV3=0, so N5=0. Because N3=1 and N4=0, the sixth node N6 is kept in conduction with the second clock signal terminal CKV2. At this time, CKV2=1, so N6=1. Same analysis as above, N5=0, N6=1, so GP_out=0, GNP_out=0, GN_out=1.

During the time period t3, IN=1. At this time, CKV1 changes to a low potential, that is, CKV1=0, so the sixth transistor T6 is turned off, and the seventh transistor T7 is turned on, thus the first node N1 is in conduction with the high-potential voltage terminal VGH, that is, N1=1. For the second node N2, because IN=1 and N1=1, the second node N2 is in conduction with the low-potential voltage terminal VGL, that is, N2=0, so that N1=1 can be kept.

Same analysis as above, N1=1, so N3=0, N4=1. Because N3=0 and N4=1, the fifth node N5 is in conduction with the high-potential voltage terminal VGH, that is, N5=1. Because N3=0 and N4=1, the sixth node N6 is in conduction with the low-potential voltage terminal VGL, that is, N6=0. Same analysis as above, N5=1, N6=0, so GP_out=1, GNP_out=1, GN_out=0.

After the time period t3, because Reset=0, IN=1, and N1=1 are kept, the potentials at the nodes N2, N3, N4, N5, N6 and the output terminals GP_out, GNP_out, and GN_out remain unchanged. When the input terminal IN receives an input pulse again, or when the reset terminal Reset receives a reset pulse again, the shift register circuit 100 according to the present disclosure will repeat the above-mentioned operations for the respective time periods.

Figure 9:
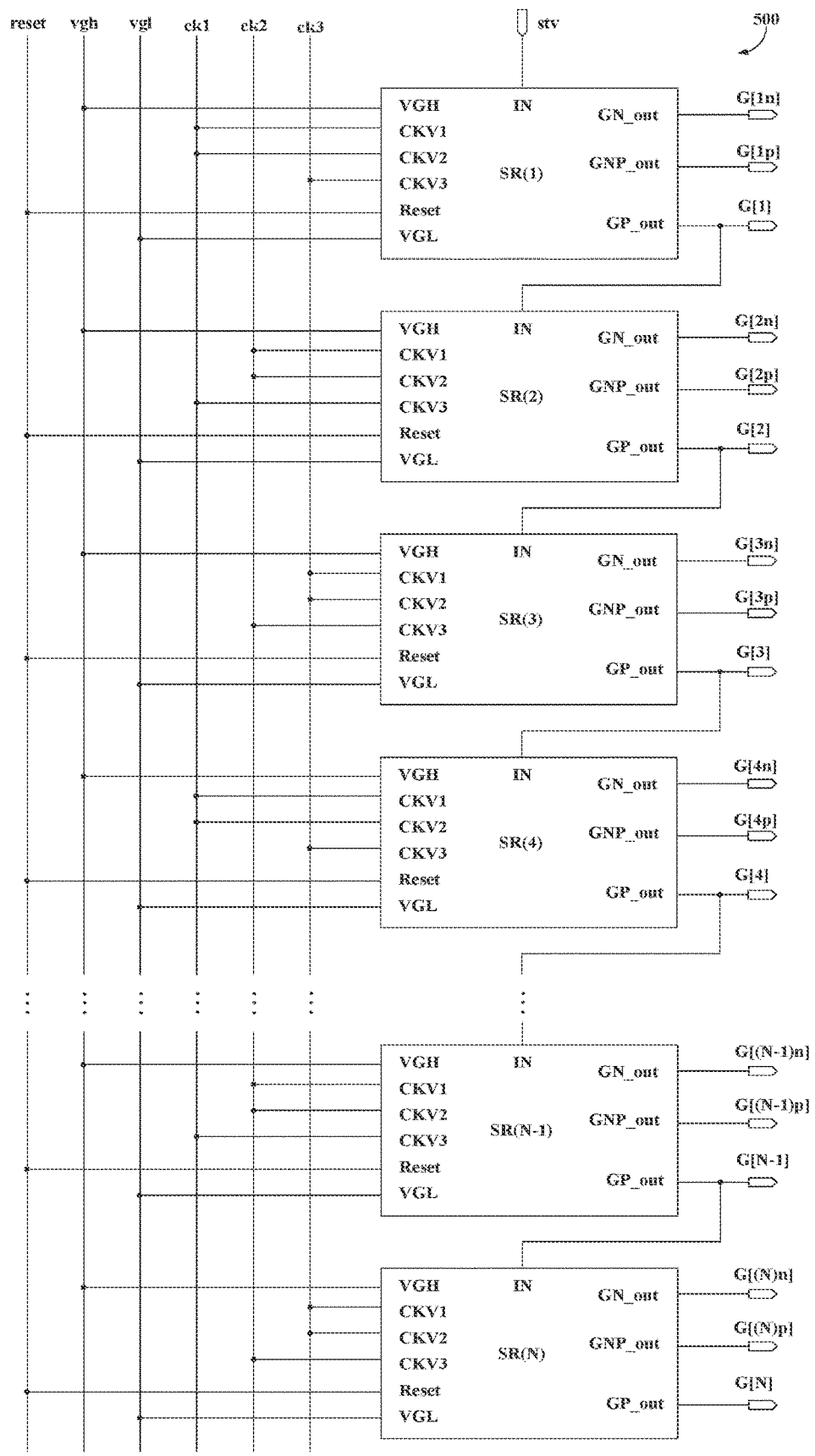
FIG. 9 schematically shows a gate driver according to an exemplary embodiment of the present disclosure.

Referring to FIG. 9, it schematically shows a gate driver 500 according to an exemplary embodiment of the present disclosure. The gate driver 500 includes N cascaded shift register circuits SR(1), SR(2), SR(3), SR(4), ..., SR(N−1) and SR(N), each of which may take the form of shift register circuit 100 as described above with respect to FIGS. 3 and 4, wherein N may be an integer greater than or equal to two. In the gate driver 500, except the first shift register circuit SR(1), the input terminal IN of each of the shift register circuits is connected to the first output terminal GP_out of the adjacent previous shift register circuit. As shown in FIG. 9, the input terminal IN of the shift register circuit SR(1) is connected to an initial signal terminal sty.

The N shift register circuits SR(1), SR(2), SR(3), SR(4), ..., SR(N−1) and SR(N) in the gate driver 500 can be respectively connected to 3N gate lines G[1], G[1n], G[1p], G[2], G[2n], G[2p], G[3], G[3n], G[3p], G[4], G[4n], ..., G[4p], G[N−1], G[(N−1)n], G[(N−1)p], G[N], G[(N)n] and G[(N)p], wherein the three output terminals of each shift register circuit can be respectively connected to one gate line. The high-potential voltage terminal VGH of each of the shift register circuits can be connected to a high-potential voltage signal line vgh operable to transmit a high-potential voltage signal, and the low-potential voltage terminal VGL of each of the shift register circuits can be connected to a low-potential voltage signal line vgl operable to transmit a low-potential voltage signal, the reset terminal Reset of each of the shift register circuits can be connected to a reset signal line reset operable to transmit a low reset pulse, the clock signal terminals of each of the register circuits can be connected to the clock signal lines operable to transmit the respective clock line signals.

Specifically, among the N shift register circuits SR(1), SR(2), SR(3), SR(4), ..., SR(N−1) and SR(N) in the gate driver 500, the first clock signal terminal and the second clock signal terminal of the (3k−2)-th shift register circuit are connected to a first clock signal line ck1, the third clock signal terminal thereof is connected to a third clock signal line ck3; the first clock signal terminal and the second clock signal terminal of the (3k−1)-th shift register circuit are connected to a second clock signal line ck2, the third clock signal terminal thereof is connected to the first clock signal line ck1; and the first clock signal terminal and the second clock signal terminal of the (3k)-th shift register circuit are connected to the third clock signal line ck3, and the third clock signal terminal thereof is connected to the second clock signal line ck2, wherein, k is an integer greater than 0, and 3k≤N+2. For the various clock line signals transmitted through the first clock signal line ck1 to the third clock signal line ck3, they have the same period, have the duty ratio of 2/3, and are sequentially delayed by 1/3 period in timing sequence from the first clock line signal to the third clock line signal. Thus, each shift register circuit can operate with the same (but "time-shifted") timing sequence in order to sequentially generate output signals as gate-on pulses.

It should be understood that, according to some exemplary embodiments of the present disclosure, in the case that the shift register circuit according to the present disclosure does not include a reset circuit, the above-mentioned wiring of the corresponding gate driver may not include a reset signal line reset for transmitting a low reset pulse.

Figure 10:
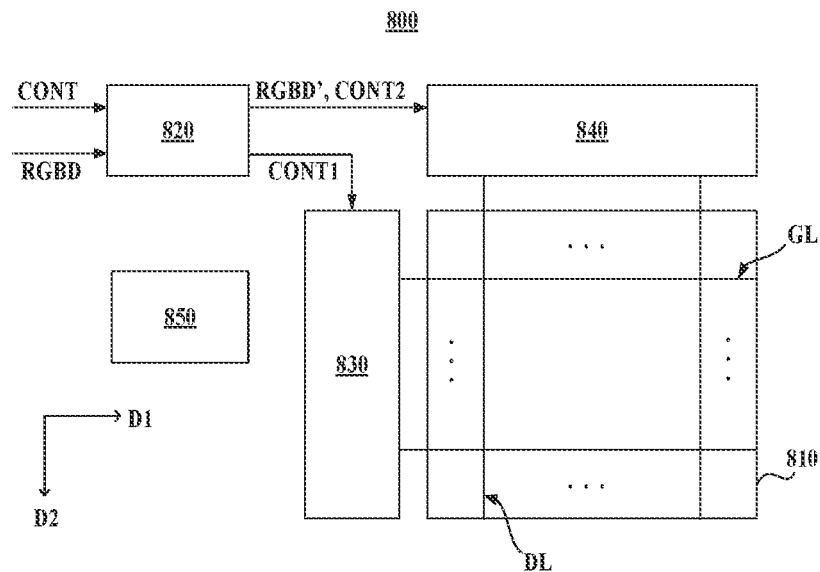
FIG. 10 schematically shows, in the form of a block diagram, a display device according to an exemplary embodiment of the present disclosure.

FIG. 10 schematically illustrates a display apparatus 800 according to an exemplary embodiment of the present disclosure in the form of a block diagram. As shown in FIG. 10, the display device 800 includes a display panel 810, a timing controller 820, a gate driver 830, a data driver 840 and a voltage generator 850. The gate driver 830 may take the form of the gate driver 500 shown and described above with respect to FIG. 9. In addition, the first clock signal line ck1, the second clock signal line ck2, the third clock signal line ck3, the high-potential voltage signal line vgh, the low-potential voltage signal line vgl, and the reset signal line reset shown in FIG. 9 are omitted in FIG. 10 for the convenience of illustration.

The display panel 810 is connected to a plurality of gate lines GL extending in a first direction D1 and a plurality of data lines DL extending in a second direction D2 that crosses (for example, substantially perpendicular to) the first direction D1. The display panel 810 includes a plurality of pixels (not shown) arranged in an array. Each of the pixels may be electrically connected to a corresponding gate line in the gate lines GL and a corresponding data line in the data lines DL. The display panel 810 may be a liquid crystal display panel, an organic light-emitting diode (OLED) display panel, or any other suitable type of display panel.

The timing controller 820 controls the operations of the display panel 810, the gate driver 830, the data driver 840 and the voltage generator 850. The timing controller 820 receives input image data RGBD and input control signals CONT from an external device (for example, a host computer). The input image data RGBD may include a plurality of input pixel data for a plurality of pixels. Each input pixel data may include the red grayscale data R, the green grayscale data G and the blue grayscale data B for a corresponding one of the plurality of pixels. The input control signals CONT may include a master clock signal, a data enable signal, a vertical synchronization signal, a horizontal synchronization signal, etc. The timing controller 820 generates the output image data RGBD', the first control signal CONT1 and the second control signal CONT2 based on the input image data RGBD and the input control signals CONT. The implementation of the timing controller 820 is known in the art. The timing controller 820 can be implemented in a lot of ways (for example but not limited to, using specialized hardwares) to perform the various functions discussed in the present disclosure. A "processor" is an example of the timing controller 820 employing one or more microprocessors, wherein the microprocessor may be programmed by using software (e.g., microcodes) to perform the various functions discussed in the present disclosure. The timing controller 820 may be implemented with or without a processor, and may also be implemented as a combination of a specialized hardware to perform some functions and a processor to perform the other functions. Examples of timing controllers 820 include, but are not limited to, conventional microprocessors, application-specific integrated circuits (ASICs), and field-programmable gate arrays (FPGAs).

The gate driver 830 receives the first control signal CONT1 from the timing controller 820. The first control signal CONT1 may include the first, second and third clock line signals transmitted via the first, second and third clock signal lines ck1, ck2 and ck3 shown in FIG. 9, and the reset pulse transmitted via the reset signal line reset. It should be understood that, according to some exemplary embodiments of the present disclosure, when the shift register circuit according to the present disclosure does not include a reset circuit, so that the wiring of the corresponding gate driver may also not include a reset signal line reset for transmitting a low reset pulse, the first control signal CONT1 may not include a reset pulse transmitted through the reset signal line reset. The gate driver 830 generates a plurality of gate driving signals for output to the gate lines GL based on the first control signal CONT1. The gate driver 830 may sequentially apply the plurality of gate driving signals to the gate lines GL.

The data driver 840 receives the second control signal CONT2 and the output image data RGBD' from the timing controller 820. The data driver 840 generates a plurality of data voltages based on the second control signal CONT2 and the output image data RGBD'. The data driver 840 may apply the plurality of data voltages as generated to the data lines DL.

The voltage generator 850 supplies power to the display panel 810, the timing controller 820, the gate driver 830, the data driver 840 and additional possible components. Specifically, the voltage generator 850 is configured to supply the high-potential voltage signal and the low-potential voltage signal transmitted via the high-potential voltage signal line vgh and the low-potential voltage signal line vgl shown in FIG. 9, respectively, under the control of the timing controller 820. The configuration of the voltage generator 850 may be known in the art. In a non-limiting embodiment, the voltage generator 850 may comprise a voltage converter such as a DC/DC converter and a crossbar switch. The voltage converter generates a plurality of output voltages with different voltage levels from an input voltage. The crossbar switch may then selectively couple these output voltages to the high-potential voltage signal line vgh and the low-potential voltage signal line vgl under the control of the timing controller 820, in order to supply the requested the high-potential voltage signal and the low-potential voltage signal.

In various embodiments, the gate driver 830 and/or the data driver 840 may be provided on the display panel 810, or may be connected to the display panel 810 by means of, for example, a tape carrier package (TCP). For example, the gate driver 830 may be integrated into the display panel 810 as a gate driver on array (GOA) circuit.

Examples of a display device 800 include, but are not limited to, a mobile phone, a tablet, a television, a display, a laptop, a digital photo frame, a navigator.

Figure 11:
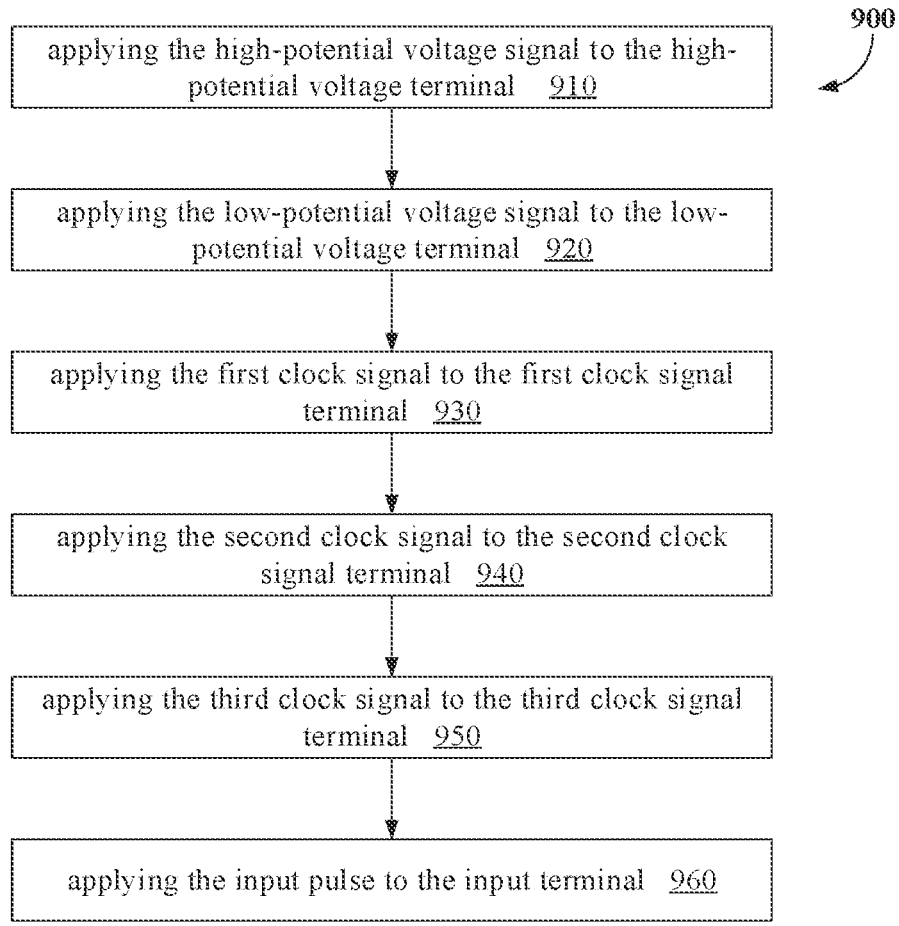
FIG. 11 schematically shows, in the form of a flow chart, an exemplary method that can be used to drive the shift register circuit shown in FIG. 3 and FIG. 4.

Referring to FIG. 11, it schematically shows an exemplary method 900 that can be used to drive the shift register circuit 100 shown in FIGS. 3 and 4 in the form of a flow chart form. As shown in FIG. 11, the method 900 may include steps 910, 920, 930, 940, 950 and 960:

at step 910, applying the high-potential voltage signal to the high-potential voltage terminal VGH;

at step 920, applying the low-potential voltage signal to the low-potential voltage terminal VGL;

at step 930, applying the first clock signal to the first clock signal terminal CKV1;

at step 940, applying the second clock signal to the second clock signal terminal CKV2;

at step 950, applying the third clock signal to the third clock signal terminal CKV3;

at step 960, applying the input pulse to the input terminal IN.

In the method 900, the first clock signal, the second clock signal and the third clock signal have the same period, have a duty ratio of 2:3, and the first clock signal and the second clock signal have the same timing sequence, the third clock signal is delayed by 2/3 period in timing sequence when compared with the first clock signal. In addition, the pulse width of the output pulse is 1/3 of the period of the above-mentioned clock signal, and the falling edge of the input pulse is aligned with one rising edge of the first clock signal in timing sequence. With the method 900 described above, the shift register circuit 100 can generate three different output signals in response to received input pulses, for use as gate-on pulses required to drive the corresponding pixel circuits.

The foregoing is a description of specific embodiments of the present disclosure, which should not be construed as limitations. A person having ordinary skills in the art may make several variations and modifications to the specific embodiments described without departing from the spirit of the present disclosure, and these variations and modifications should also be deemed as falling within the scope of the present disclosure.

What is claimed is:

1. A shift register circuit comprising:
   an input circuit configured to: in response to at least one of an input terminal providing an input pulse and a first node being at a low potential, bring a second node into conduction with a high-potential voltage terminal providing a high-potential voltage signal, and in response to both the input terminal and the first node being at a high potential, bring the second node into conduction with a low-potential voltage terminal providing a low-potential voltage signal;
   a first control circuit configured to: in response to at least one of a first clock signal terminal providing a first clock signal and the second node being at a low potential, bring the first node into conduction with the high-potential voltage terminal, and in response to both the first clock signal terminal and the second node being at a high potential, bring the first node into conduction with the low-potential voltage terminal;
   a second control circuit configured to: in response to the first node being at a high potential, bring a third node into conduction with the low-potential voltage terminal, and in response to the first node being at a low potential, bring the third node into conduction with the high-potential voltage terminal;
   a third control circuit configured to: in response to the third node being at a high potential, bring a fourth node into conduction with the low-potential voltage terminal, and in response to the third node being at a low potential, bring the fourth node into conduction with the high-potential voltage terminal;
   a fourth control circuit configured to: in response to the third node being at low potential and the fourth node being at high potential, bring a fifth node into conduction with the high-potential voltage terminal, and in response to the third node being at high potential and the fourth node being at low potential, bring the fifth node into conduction with a third clock signal terminal providing a third clock signal;

a fifth control circuit configured to: in response to the third node being at a low potential and the fourth node being at a high potential, bring a sixth node into conduction with the low-potential voltage terminal, and in response to the third node being at a high potential and the fourth node being at a low potential, bring the sixth node into conduction with a second clock signal terminal providing a second clock signal;

a first output circuit configured to: in response to the fifth node being at a low potential, bring a first output terminal providing a first output signal into conduction with the low-potential voltage terminal, and in response to the fifth node being at a high potential, bring the first output terminal into conduction with the high-potential voltage terminal;

a second output circuit configured to: in response to the sixth node being at a low potential, bring a second output terminal providing a second output signal into conduction with the high-potential voltage terminal, and in response to the sixth node being at a high potential, bring the second output terminal into conduction with the low-potential voltage terminal; and a third output circuit configured to: in response to the sixth node being at a low potential, bring a third output terminal providing a third output signal into conduction with the low-potential voltage terminal, and in response to the sixth node point being at a high potential, bring the third output terminal into conduction with the high-potential voltage terminal.

2. The shift register circuit of claim 1, wherein the input circuit comprises:

a first transistor of an N-type transistor, comprising a first electrode connected to the low-potential voltage terminal and a control electrode connected to the first node;

a second transistor of an N-type transistor, comprising a first electrode connected to a second electrode of the first transistor, a second electrode connected to the second node, and a control electrode connected to the input terminal;

a third transistor of a P-type transistor, comprising a first electrode connected to the second node, a second electrode connected to the high-potential voltage terminal, and a control electrode connected to the input terminal; and a fourth transistor of a P-type transistor, comprising a first electrode connected to the second node, a second electrode connected to the high-potential voltage terminal and a control electrode connected to the first node.

3. The shift register circuit of claim 1, wherein the first control circuit comprises:

a fifth transistor of an N-type transistor, comprising a first electrode connected to the low-potential voltage terminal and a control electrode connected to the second node;

a sixth transistor of an N-type transistor, comprising a first electrode connected to a second electrode of the fifth transistor, a second electrode connected to the first node, and a control electrode connected to the first clock signal terminal;

a seventh transistor of a P-type transistor, comprising a first electrode connected to the first node, a second electrode connected to the high-potential voltage terminal, and a control electrode connected to the first clock signal terminal; and an eighth transistor of a P-type transistor, comprising a first electrode connected to the first node, a second electrode connected to the high-potential voltage terminal, and a control electrode connected to the second node.

4. The shift register circuit of claim 1, wherein the second control circuit comprises:

a ninth transistor of an N-type transistor, comprising a first electrode connected to the low-potential voltage terminal, a second electrode connected to the third node, and a control electrode connected to the first node; and a tenth transistor of a P-type transistor, comprising a first electrode connected to the third node, a second electrode connected to the high-potential voltage terminal, and a control electrode connected to the first node.

5. The shift register circuit of claim 1, wherein the third control circuit comprises:

an eleventh transistor of an N-type transistor, comprising a first electrode connected to the low-potential voltage terminal, a second electrode connected to the fourth node, and a control electrode connected to the third node; and a twelfth transistor of a P-type transistor, comprising a first electrode connected to the fourth node, a second electrode connected to the high-potential voltage terminal, and a control electrode connected to the third node.

6. The shift register circuit of claim 1, wherein the fourth control circuit comprises:

a thirteenth transistor of a P-type transistor, comprising a first electrode connected to the fifth node, a second electrode connected to the high-potential voltage terminal, and a control electrode connected to the third node;

a fourteenth transistor of an N-type transistor, comprising a first electrode connected to the third clock signal terminal, a second electrode connected to the fifth node, and a control electrode connected to the third node; and a fifteenth transistor of a P-type transistor, comprising a first electrode connected to the third clock signal terminal, a second electrode connected to the fifth node, and a control electrode connected to the fourth node.

7. The shift register circuit of claim 1, wherein the fifth control circuit comprises:

a sixteenth transistor of an N-type transistor, comprising a first electrode connected to the second clock signal terminal, a second electrode connected to the sixth node, and a control electrode connected to the third node;

a seventeenth transistor of a P-type transistor, comprising a first electrode connected to the second clock signal terminal, a second electrode connected to the sixth node, and a control electrode connected to the fourth node; and an eighteenth transistor of an N-type transistor, comprising a first electrode connected to the low-potential voltage terminal, a second electrode connected to the sixth node, and a control electrode connected to the fourth node.

8. The shift register circuit of claim 1, wherein the first output circuit comprises:

a nineteenth transistor of an N-type transistor, comprising a first electrode connected to the low-potential voltage terminal, and a control electrode connected to the fifth node;

a twentieth transistor of a P-type transistor, comprising a first electrode connected to a second electrode of the nineteenth transistor, a second electrode connected to the high-potential voltage terminal, and a control electrode connected to the fifth node;
a twenty-first transistor of an N-type transistor, comprising a first electrode connected to the low-potential voltage terminal, a second electrode connected to the first output terminal, and a control electrode connected to the second electrode of the nineteenth transistor; and
a twenty-second transistor of a P-type transistor, comprising a first electrode connected to the first output terminal, a second electrode connected to the high-potential voltage terminal, and a control electrode connected to the control electrode of the twenty-first transistor.

9. The shift register circuit of claim 1, wherein the second output circuit comprises:
a twenty-third transistor of an N-type transistor, comprising a first electrode connected to the low-potential voltage terminal, and a control electrode connected to the sixth node;
a twenty-fourth transistor of a P-type transistor, comprising a first electrode connected to a second electrode of the twenty-third transistor, a second electrode connected to the high-potential voltage terminal, and a control electrode connected to the sixth node;
a twenty-fifth transistor of an N-type transistor, comprising a first electrode connected to the low-potential voltage terminal, and a control electrode connected to the second electrode of the twenty-third transistor;
a twenty-sixth transistor of a P-type transistor, comprising a first electrode connected to a second electrode of the twenty-fifth transistor, a second electrode connected to the high-potential voltage terminal, and a control electrode connected to the control electrode of the twenty-fifth transistor;
a twenty-seventh transistor of an N-type transistor, comprising a first electrode connected to the low-potential voltage terminal, a second electrode connected to the second output terminal, and a control electrode connected to the second electrode of the twenty-fifth transistor; and
a twenty-eighth transistor of a P-type transistor, comprising a first electrode connected to the second output terminal, a second electrode connected to the high-potential voltage terminal, and the control electrode connected to the control electrode of the twenty-seventh transistor.

10. The shift register circuit of claim 1, wherein the third output circuit comprises:
a twenty-ninth transistor of an N-type transistor, comprising a first electrode connected to the low-potential voltage terminal, and a control electrode connected to the sixth node;
a thirtieth transistor of a P-type transistor, comprising a first electrode connected to a second electrode of the twenty-ninth transistor, a second electrode connected to the high-potential voltage terminal, and a control electrode connected to the sixth nodes;
a thirty-first transistor of an N-type transistor, comprising a first electrode connected to the low-potential voltage terminal, a second electrode connected to the third output terminal, and a control electrode connected to the second electrode of the twenty-ninth transistor; and
a thirty-second transistor of a P-type transistor, comprising a first electrode connected to the third output terminal, a second electrode connected to the high-potential voltage terminal, and a control electrode connected to the control electrode of the thirty-first transistor.

11. The shift register circuit of claim 1, further comprising a reset circuit configured to: in response to a reset terminal providing a reset pulse being at a high potential, bring the first node into conduction with the low-potential voltage terminal.

12. The shift register circuit of claim 11, wherein the reset circuit comprises a thirty-third transistor of an N-type transistor, comprising a first electrode connected to the low-potential voltage terminal, a second electrode connected to the first node, and a control electrode connected to the reset terminal.

13. A gate driver, comprising N shift register circuits of claim 11 that are cascaded,
wherein N is an integer greater than or equal to 2, and
wherein a first output terminal of an m-th shift register circuit of the N shift register circuits is connected to an input terminal of an (m+1)-th shift register circuit of the N shift register circuits, m is an integer and 1≤m<N.

14. A display panel, comprising:
the gate driver of claim 13;
a high-potential voltage signal line configured to transmit the high-potential voltage signal;
a low-potential voltage signal line configured to transmit the low-potential voltage signal;
a first clock signal line configured to transmit a first clock line signal;
a second clock signal line configured to transmit a second clock line signal;
a third clock signal line configured to transmit a third clock line signal; and
a reset signal line configured to transmit the reset pulse,
wherein, a high-potential voltage terminal of each shift register circuit is connected to the high-potential voltage signal line,
wherein, a low-potential voltage terminal of each shift register circuit is connected to the low-potential voltage signal line,
wherein, a reset terminal of each shift register circuit is connected to the reset signal line,
wherein a first clock signal terminal and a second clock signal terminal of a (3k−2)-th shift register circuit of the N shift register circuits are connected to the first clock signal line, and a third clock signal terminal of the (3k−2)-th shift register circuit is connected to the third clock signal line,
wherein a first clock signal terminal and a second clock signal terminal of a (3k−1)-th shift register circuit of the N shift register circuits are connected to the second clock signal line, and a third clock signal terminal of the (3k−1)-th shift register circuit is connected to the first clock signal line,
wherein a first clock signal terminal and a second clock signal terminal of a (3k)-th shift register circuit of the N shift register circuits are connected to the third clock signal line, and a third clock signal terminal of the (3k)-th shift register circuit is connected to the second clock signal line,
wherein k is an integer greater than 0, and 3k≤N+2, and
wherein the first clock line signal, the second clock line signal, and the third clock line signal have a same period, have a duty ratio of 2/3, and are sequentially delayed by 1/3 period in timing sequence.

15. A display device, comprising:
the display panel of claim 14;
a timing controller configured to control operation of the display panel, wherein the timing controller is configured to provide the first clock line signal, the second clock line signal, the third clock signal line and the reset pulse to the first clock signal line, the second clock signal line, the third clock signal line and the reset signal line, respectively; and
a voltage generator configured to provide the high-potential voltage signal and the low-potential voltage signal to the high-potential voltage signal line and the low-potential voltage signal line, respectively.

16. A gate driver, comprising N shift register circuits of claim 1 that are cascaded,
wherein N is an integer greater than or equal to 2, and
wherein a first output terminal of an m-th shift register circuit of the N shift register circuits is connected to an input terminal of an (m+1)-th shift register circuit of the N shift register circuits, m is an integer and 1≤m<N.

17. A display panel, comprising:
the gate driver of claim 16;
a high-potential voltage signal line configured to transmit the high-potential voltage signal;
a low-potential voltage signal line configured to transmit the low-potential voltage signal;
a first clock signal line configured to transmit a first clock line signal;
a second clock signal line configured to transmit a second clock line signal; and
a third clock signal line configured to transmit a third clock line signal;
wherein a high-potential voltage terminal of each shift register circuit is connected to the high-potential voltage signal line,
wherein a low-potential voltage terminal of each shift register circuit is connected to the low-potential voltage signal line,
wherein a first clock signal terminal and a second clock signal terminal of a (3k−2)-th shift register circuit of the N shift register circuits are connected to the first clock signal line, and a third clock signal terminal of the (3k−2)-th shift register circuit is connected to the third clock signal line,
wherein a first clock signal terminal and a second clock signal terminal of a (3k−1)-th shift register circuit of the N shift register circuits are connected to the second clock signal line, and a third clock signal terminal of the (3k−1)-th shift register circuit is connected to the first clock signal line,
wherein a first clock signal terminal and a second clock signal terminal of a (3k)-th shift register circuit of the N shift register circuits are connected to the third clock signal line, and a third clock signal terminal of the (3k)-th shift register circuit is connected to the second clock signal line,
wherein k is an integer greater than 0, and 3k≤N+2, and
wherein the first clock line signal, the second clock line signal, and the third clock line signal have a same period, have a duty ratio of 2/3, and are sequentially delayed by 1/3 period in timing sequence.

18. A display device, comprising:
the display panel of claim 17;
a timing controller configured to control operation of the display panel, wherein the timing controller is configured to provide the first clock line signal, the second clock line signal and the third clock signal line to the first clock signal line, the second clock signal line and the third clock signal line, respectively; and
a voltage generator configured to provide the high-potential voltage signal and the low-potential voltage signal to the high-potential voltage signal line and the low-potential voltage signal line, respectively.

19. A method for driving the shift register circuit of claim 1, comprising:
applying the high-potential voltage signal to the high-potential voltage terminal;
applying the low-potential voltage signal to the low-potential voltage terminal;
applying the first clock signal to the first clock signal terminal;
applying the second clock signal to the second clock signal terminal;
applying the third clock signal to the third clock signal terminal; and
applying the input pulse to the input terminal,
wherein, the first clock signal, the second clock signal and the third clock signal have a same period, have a duty ratio of 2/3, the first clock signal and the second clock signal have a same timing sequence, and the third clock signal is delayed by 2/3 period in timing sequence when compared with the first clock signal, and
wherein, a pulse width of the output signal is 1/3 of the period, and a falling edge of the input pulse is aligned with a rising edge of the first clock signal in timing sequence.

* * * * *